US006753222B2

(12) United States Patent
Mimuro et al.

(10) Patent No.: US 6,753,222 B2
(45) Date of Patent: Jun. 22, 2004

(54) METHOD OF MANUFACTURING SEMICONDUCTOR DEVICE

(75) Inventors: Ken Mimuro, Kusatsu (JP); Hiroyuki Doi, Tonami (JP); Yasushi Okuda, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/271,879

(22) Filed: Oct. 15, 2002

(65) Prior Publication Data

US 2003/0082878 A1 May 1, 2003

(30) Foreign Application Priority Data

Oct. 30, 2001 (JP) ....................................... 2001-332563

(51) Int. Cl.[7] .......................................... H01L 21/336
(52) U.S. Cl. ....................................... 438/257; 438/680
(58) Field of Search ............................... 438/257, 258, 438/259, 260, 262, 263, 264, 265, 266, 267, 660, 662, 680, 689, 706, 745

(56) References Cited

U.S. PATENT DOCUMENTS

| 4,446,467 | A | * | 5/1984 | Takiguchi et al. | ............. | 346/76 |
| 5,679,493 | A | * | 10/1997 | Kai | .............................. | 430/126 |
| 5,909,083 | A | * | 6/1999 | Asano et al. | ................ | 313/584 |
| 6,316,314 | B1 | * | 11/2001 | Ishige | ........................ | 438/258 |
| 6,417,086 | B1 | | 7/2002 | Osari | | |
| 6,620,690 | B2 | | 9/2003 | Lee et al. | | |

FOREIGN PATENT DOCUMENTS

| JP | 4-257255 | 9/1992 |
| JP | 5-48046 | 2/1993 |
| JP | 2000-243937 | 9/2000 |
| JP | 2000-286350 | 10/2000 |
| JP | 2000-133445 | 5/2003 |

* cited by examiner

Primary Examiner—David Nhu
(74) Attorney, Agent, or Firm—Merchant & Gould P.C.

(57) ABSTRACT

A method for forming a semiconductor device is provided that allows a desirable semiconductor device to be obtained by preventing a gate electrode of a non-volatile semiconductor memory from having an abnormal shape and the surfaces of high concentration source and drain regions of the non-volatile semiconductor memory from being worn away. The method includes a first step of forming a non-volatile semiconductor memory in a first region of a substrate of the semiconductor device and a second step of forming a semiconductor device in a second region on the substrate. The non-volatile semiconductor memory includes a first gate including a tunnel insulating film, a floating gate electrode, a capacitor insulating film, and a control gate electrode, and the semiconductor device includes a second gate including a gate insulating film and a gate electrode. In this method, during patterning of the second gate, a surface of the first gate is covered with a protective film that hardly can be etched by an etchant used for the patterning of the second gate.

19 Claims, 12 Drawing Sheets

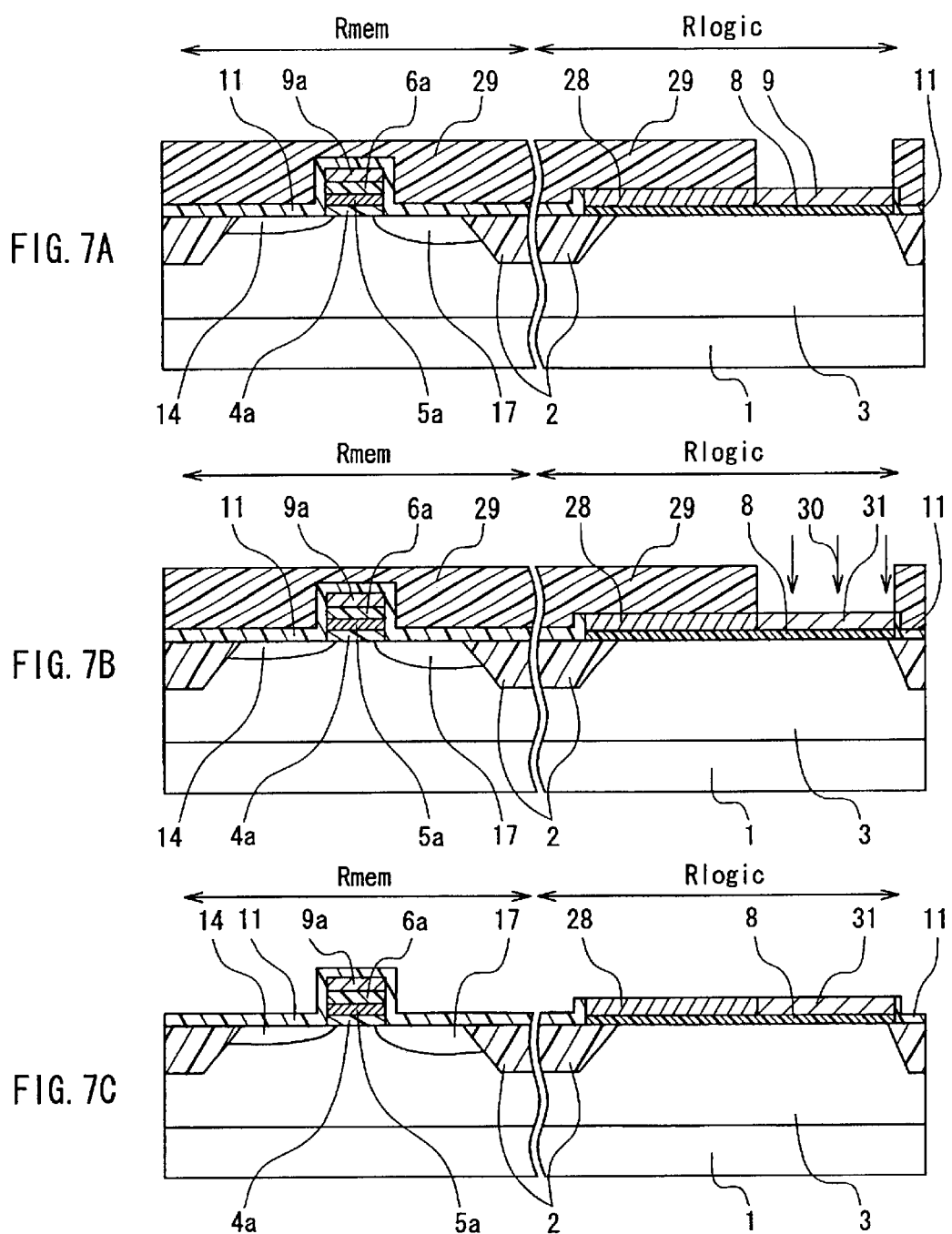

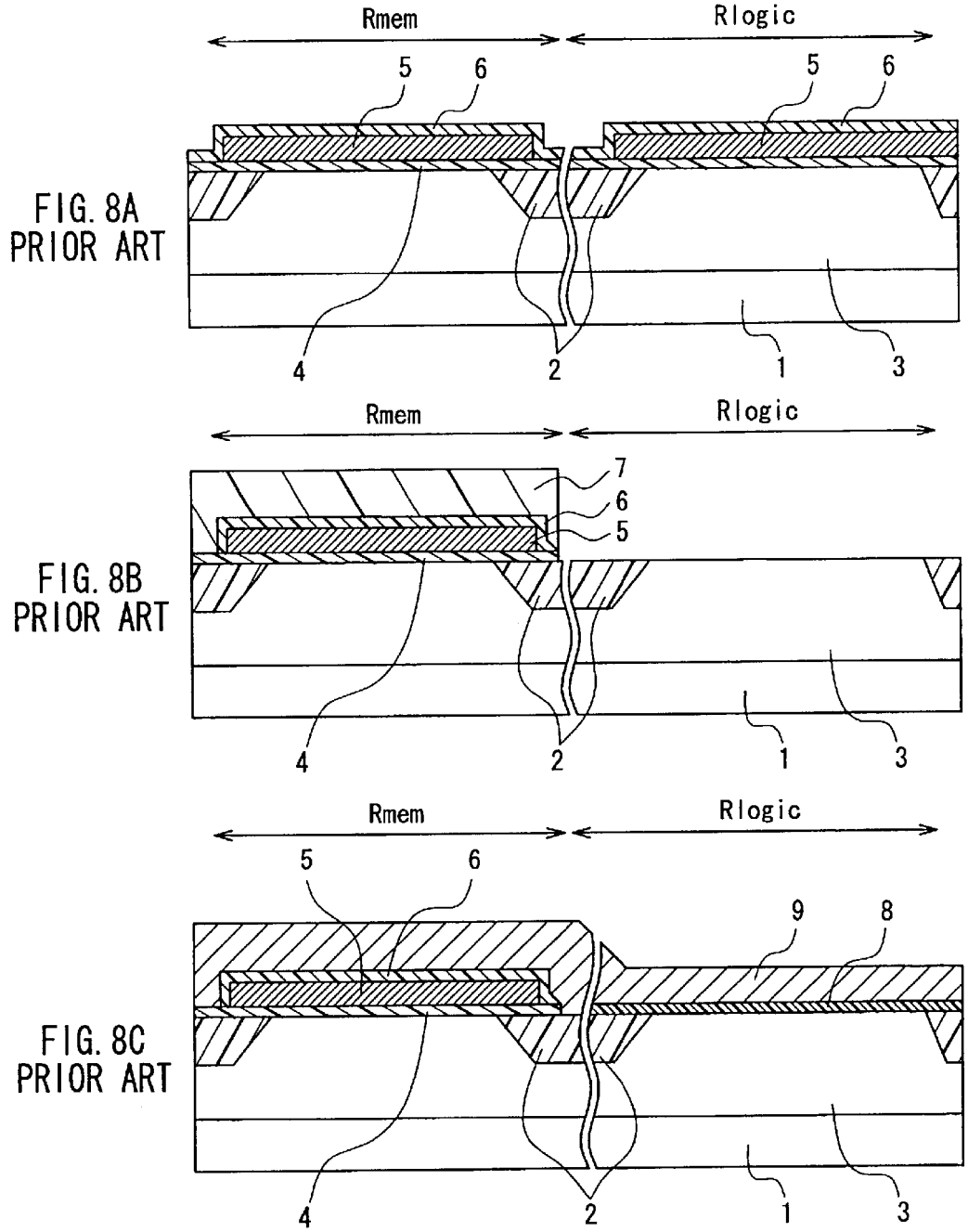

METHOD OF MANUFACTURING SEMICONDUCTOR DEVICE

BACKGROUND OF THE INVENTION

1. Field of the Invention

The present invention relates to a method for manufacturing a semiconductor device in which a non-volatile semiconductor memory, such as a flash memory, and a standard semiconductor device of MOS-type are formed on the same substrate.

2. Description of the Related Art

Hereinafter, a conventional method for manufacturing a semiconductor device provided with a non-volatile semiconductor memory and a semiconductor device will be described with reference to the drawings. FIGS. 8A to 12B are cross-sectional views illustrating the steps in a conventional method for manufacturing the semiconductor device. In FIGS. 8A to 12B, a region where the non-volatile semiconductor memory is to be formed is indicated as a memory region $R_{mem}$ and a region where the standard semiconductor device is to be formed is indicated as a logic region $R_{logic}$.

First, as shown in FIG. 8A, an insulating film 2, for separating the non-volatile semiconductor memory and the semiconductor device, and a p-well 3 are formed on a p-type silicon substrate 1. Next, a first insulating film 4, a first polysilicon film 5, and a second insulating film 6 are formed in an active region of the p-type silicon substrate 1 successively.

Then, as shown in FIG. 8B, using a resist pattern 7 as a mask, the second insulating film 6 and the first polysilicon film 5 on the logic region $R_{logic}$ are removed by etching.

Further, as shown in FIG. 8C, a third insulating film 8 is formed by oxidizing the substrate surface in the logic region $R_{logic}$. Thereafter, a second polysilicon film 9 is formed. The thickness of the second polysilicon film 9 at this time is about 200 nm, for example.

In general, the second insulating film 6 has a three-layer structure including a silicon oxide film/silicon nitride film ($Si_3N_4$)/silicon oxide film, although this structure is not specifically illustrated in the drawings. The silicon oxide film at the top of the second insulating film 6 is formed by the thermal oxidation performed when forming the third insulating film 8 in the logic region $R_{logic}$.

Subsequently, as shown in FIG. 9A, the second polysilicon film 9, the second insulating film 6, the first polysilicon film 5, and the first insulating film 4 in the memory region $R_{mem}$ are etched using a resist pattern 10 as a mask. As a result, a control gate electrode 9a, a capacitor insulating film 6a, a floating gate electrode 5a, and a tunnel insulating film 4a are formed, respectively.

Then, as shown in FIG. 9B, a silicon oxide film 11 is formed on the entire surface of the p-type silicon substrate 1 by chemical vapor deposition (CVD) or thermal oxidation. The thickness of the silicon oxide film 11 at this time is about 20 nm, for example.

Next, as shown in FIG. 9C, using a resist pattern 12 as a mask, ion implantation 13 is performed for forming a source of the non-volatile semiconductor memory. As a result, a high concentration source region 14 is formed.

After that, as shown in FIG. 10A, using a resist pattern 15 as a mask, ion implantation 16 is performed for forming a drain of the non-volatile semiconductor memory. As a result, a high concentration drain region 17 is formed. The silicon oxide film 11 has been formed so that it can serve as a protective oxide film for preventing the tunnel insulating film 4a and capacitor insulating film 6a from being damaged by the ion implantations for forming the source and the drain of the non-volatile semiconductor memory on the side faces of the gate electrode of the non-volatile semiconductor memory.

The silicon oxide film 11 is then removed by etching as shown in FIG. 10B. After that, a resist pattern 18 for forming a gate electrode of the semiconductor device in the logic region $R_{logic}$ is formed as shown in FIG. 10C.

Subsequently, as shown in FIG. 11A, the second polysilicon film 9 in the logic region $R_{logic}$ is etched using the resist pattern 18 as a mask. As a result, a gate electrode 9b of the semiconductor device is formed. After that, the resist pattern 18 is removed. Then, using another resist pattern (not shown) that exposes the logic region $R_{logic}$, ion implantation for forming a low concentration drain region 32 and a low concentration source region 33 is performed in the logic region $R_{logic}$. After that, this resist pattern is removed. This brings about the state as shown in FIG. 11B.

Next, as shown in FIG. 12A, a silicon oxide film 21 as an insulating material is formed on the entire surface of the p-type silicon substrate 1 by CVD so that source and drain regions of the semiconductor device in the logic region $R_{logic}$ to be formed later will have an LDD structure.

Thereafter, as shown in FIG. 12B, the silicon oxide film 21 is etched by anisotropic etching until the upper face of a first gate 19 (see FIG. 11B) in the memory region $R_{mem}$ and the upper face of a second gate 20 (see FIG. 11B) in the logic region $R_{logic}$ are exposed. As a result, a side-wall oxide film 22 made of silicon oxide film 21 is formed on the side walls of the first gate 19 and the second gate 20. After that, the semiconductor device in the logic region $R_{logic}$ is subjected to necessary ion implantations (for forming a high concentration source region 35 and a high concentration drain region 34) and wiring (not shown) to obtain a desired semiconductor device.

However, in the above-mentioned conventional method for manufacturing a semiconductor device, with the miniaturization of elements used in the semiconductor device, new problems arise as follows.

The first problem is as follows. The thickness of the resist pattern 18 shown in FIG. 10C has been made thinner in order to form a minute pattern. For example, when forming a pattern of 0.25 $\mu$m or less by photolithography using a KrF excimer laser, the thickness of the resist pattern 18 is in a range from 0.5 to 0.7 $\mu$m.

In this case, as shown in FIG. 10C, since the logic region $R_{logic}$ substantially is flat, the thickness of the resist pattern 18 formed by photolithography can remain in a range from 0.5 to 0.7 $\mu$m in the logic region $R_{logic}$. In contrast, in the memory region $R_{mem}$, the resist pattern 18 cannot have a uniform thickness since the laminated-type gate electrode pattern already has been formed. The resist pattern 18 has a small thickness, particularly above the gate electrode pattern.

Further, as shown in FIG. 11A, the second polysilicon film 9 is etched by dry etching using the above-mentioned resist pattern 18 as a mask. However, during the etching, since the selective ratio of the polysilicon film to the resist pattern generally is low, the resist pattern covering the electrode pattern in the memory region $R_{mem}$ is removed before the etching of the gate electrode pattern in the logic region $R_{logic}$ is completed. Accordingly, although the etching step as a whole is not yet completed, the electrode pattern itself is exposed in the memory region $R_{mem}$. This leads to a problem that the control gate electrode 9a included in the electrode pattern in the memory region $R_{mem}$ is etched to have an abnormal shape, resulting in a defective pattern.

The second problem is as follows. In the logic region $R_{logic}$, the second gate of the semiconductor device is formed and the ion implantation for forming the low concentration drain region 32 is performed, as shown in FIGS. 11A and 11B. However, in a series of steps in which the formation of the resist pattern and the removal thereof are repeated, since a cleaning step is performed every time after the formation or the removal is completed, the surface of the high concentration source region 14 and the surface of the high concentration drain region 17 may be worn away by these cleaning steps. This may reduce the current flowing though the non-volatile semiconductor memory and interfere with a stable supply of current in the non-volatile semiconductor memory.

SUMMARY OF THE INVENTION

Therefore, with the foregoing in mind, it is an object of the present invention to provide a method for forming a semiconductor device that allows a desirable semiconductor device to be obtained by preventing, when patterning a gate electrode of a semiconductor device, a gate electrode of a non-volatile semiconductor memory that has been already patterned from having an abnormal shape and reducing the chances that the surfaces of high concentration source and drain regions of the non-volatile semiconductor memory may be worn away to cause reduction and fluctuation in a transistor current.

In order to achieve the above-mentioned object, a method for forming a semiconductor device according to the present invention includes a first step of forming a non-volatile semiconductor memory in a first region of a substrate of the semiconductor device and a second step of forming a semiconductor device in a second region on the substrate. The non-volatile semiconductor memory includes a first gate including a tunnel insulating film, a floating gate electrode, a capacitor insulating film, and a control gate electrode, and the semiconductor device includes a second gate including a gate insulating film and a gate electrode. In this method, during patterning of the second gate, a surface of the first gate is covered with a protective film that hardly can be etched by an etchant used for the patterning of the second gate. It is to be noted here that some etching of the protective film may be tolerated, as long as the protective film has a high resistance to the etchant.

According to this configuration, when patterning the gate electrode of the semiconductor device, the gate electrode of the non-volatile semiconductor memory that has been already patterned is prevented from being removed further by etching. Accordingly, the gate electrode of the non-volatile semiconductor memory is prevented from being formed in an abnormal shape, thus allowing the semiconductor device having a normal shape to be obtained.

Further, in the method for forming a semiconductor device according to the present invention, it is preferable that a height of the first gate is at least 200 nm greater than that of the second gate.

Furthermore, in the method for forming a semiconductor device according to the present invention, it is preferable that the protective film is a photosensitive resin film that has been cured.

Still further, in the method for forming a semiconductor device according to the present invention, it is preferable that a source region and a drain region of the non-volatile semiconductor memory are covered with the protective film when a mask material that has been used for patterning the second gate is removed.

According to the above-mentioned preferable configurations, it becomes possible to reduce the chances that the surfaces of high concentration source and drain regions of the non-volatile semiconductor memory may be worn away to cause reduction and fluctuation in a transistor current.

Further, in the method for forming a semiconductor device according to the present invention, it is preferable that the protective film is one film selected from a silicon oxide film, a silicon nitride film, and a silicon oxynitride film, or a multilayer film including two or more of these films.

Furthermore, in the method for forming a semiconductor device according to the present invention, it is preferable that the protective film is formed by chemical vapor deposition.

Still further, in the method for forming a semiconductor device according to the present invention, it is preferable that the protective film is a silicon oxide film formed by thermal oxidation.

These and other advantages of the present invention will become apparent to those skilled in the art upon reading and understanding the following detailed description with reference to the accompanying figures.

BRIEF DESCRIPTION OF THE DRAWINGS

FIGS. 7A to 7C are cross-sectional views illustrating other steps in the method for manufacturing a semiconductor device according to Embodiment 3 of the present invention.

FIGS. 8A to 8C are cross-sectional views illustrating steps in a conventional method for manufacturing a semiconductor device.

DETAILED DESCRIPTION OF THE INVENTION (Embodiment 1)

Figure 1A:
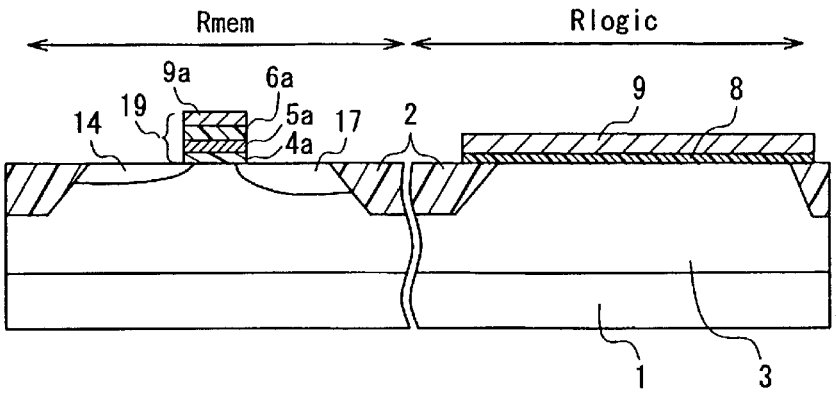
FIGS. 1A to 1C are cross-sectional views illustrating steps in a method for manufacturing a semiconductor device according to Embodiment 1 of the present invention.
Figure 1B:
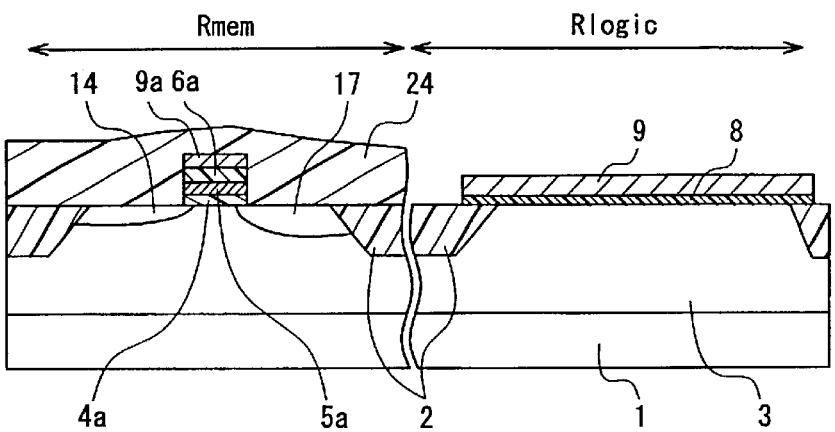
Figure 1C:
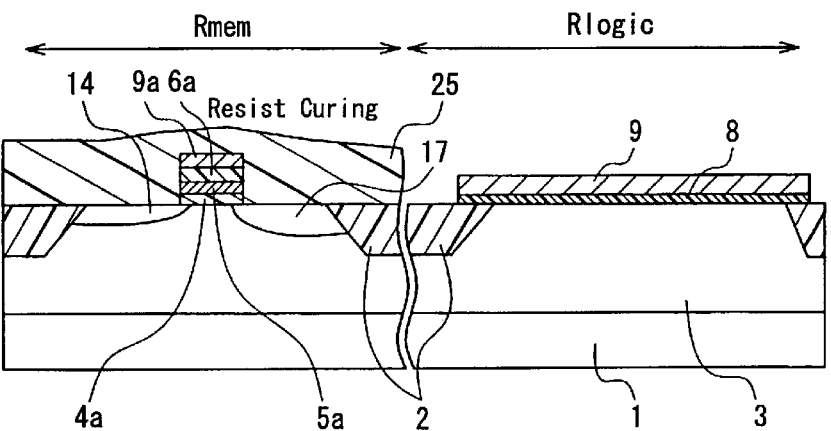

Hereinafter, a method for manufacturing a semiconductor device according to Embodiment 1 will be described with reference to the drawings. In Embodiment 1, since the steps performed prior to the step shown in FIG. 1A are the same as the conventional steps shown in FIGS. 8A to 10B, a description thereof has been omitted herein. FIGS. 1A to 1C are cross-sectional views illustrating steps in a method for manufacturing a semiconductor device according to Embodiment 1 of the present invention.

In FIGS. 1A to 1C, a first region where a non-volatile semiconductor memory such as an EEPROM or a flash memory is to be formed is indicated as a memory region $R_{mem}$. A second region where a standard semiconductor device such as a logic semiconductor device like an n-channel type MOS transistor or a p-channel type MOS transistor is to be formed is indicated as a logic region $R_{logic}$.

FIG. 1A is a cross-sectional view showing the state of the semiconductor device after a first gate 19 of the non-volatile semiconductor memory has been formed in the memory region $R_{mem}$. In the memory region $R_{mem}$, a tunnel insulating film 4a, a floating gate electrode 5a, a capacitor insulating film 6a, and a control gate electrode 9a are formed successively. On the other hand, in the logic region $R_{logic}$, a third insulating film 8 and a second polysilicon film 9 are formed on an insulating film 2 for separating the non-volatile semiconductor memory and the semiconductor device, a p-well 3, and a p-type silicon substrate 1.

Next, as shown in FIG. 1B, the memory region $R_{mem}$ is covered with a resist pattern 24 that exposes the logic region $R_{logic}$. Then, as shown in FIG. 1C, the resist pattern 24 covering the memory region $R_{mem}$ is cured by a UV cure method, for example. As a photosensitive resin used for forming the resist pattern 24, a novolac-based photoresist, e.g., an i-line photoresist, preferably is used. The reason for this is that, since a resist pattern 25 obtained by curing the resist pattern 24 serves as a protective film during dry etching as described later, the novolac-based photoresist preferably is used for its high dry etching resistance. The thickness of the resist pattern 25 generally is in a range from 0.7 to 2 $\mu$m, and in the present embodiment, the thickness of the resist pattern 25 was set to 1 $\mu$m. According to a UV cure method, the p-type silicon substrate 1 is irradiated with UV rays from a mercury lamp or the like to be heated to 100° C. to 200° C. so that the resist is cured and improved in dry etching resistance. When the resist is merely heated, it is cured and improved in dry etching resistance. However, it is more preferable to use the UV cure method.

Figure 2A:
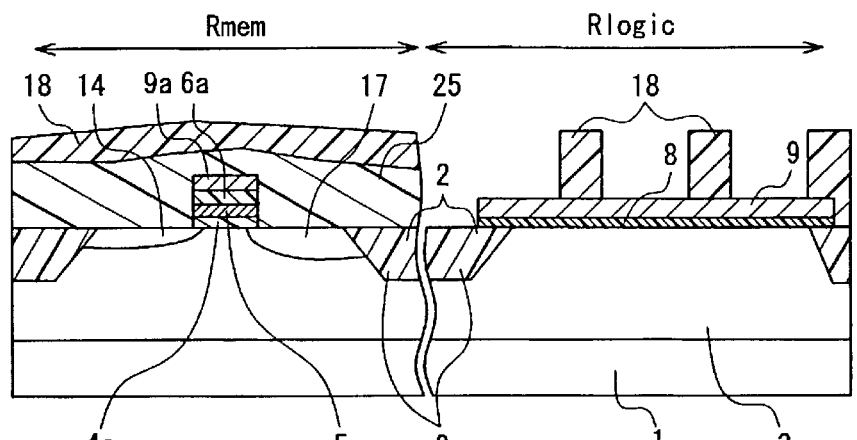
FIGS. 2A to 2C are cross-sectional views illustrating other steps in the method for manufacturing a semiconductor device according to Embodiment 1 of the present invention.

Subsequently, as shown in FIG. 2A, a resist pattern 18 is formed on the p-type silicon substrate 1 so that a gate electrode pattern 18 is formed on the second polysilicon film 9 in the logic region $R_{logic}$. The resist pattern 18 at this time is of a positive type and 0.7 $\mu$m in thickness and formed by photolithography using a KrF excimer laser, for example. Further, the size of the gate electrode pattern is 0.25 $\mu$m, for example. At this time, the resist pattern 25 and the resist pattern 18 are laminated on the first gate 19 in the memory region $R_{mem}$.

Figure 2B:
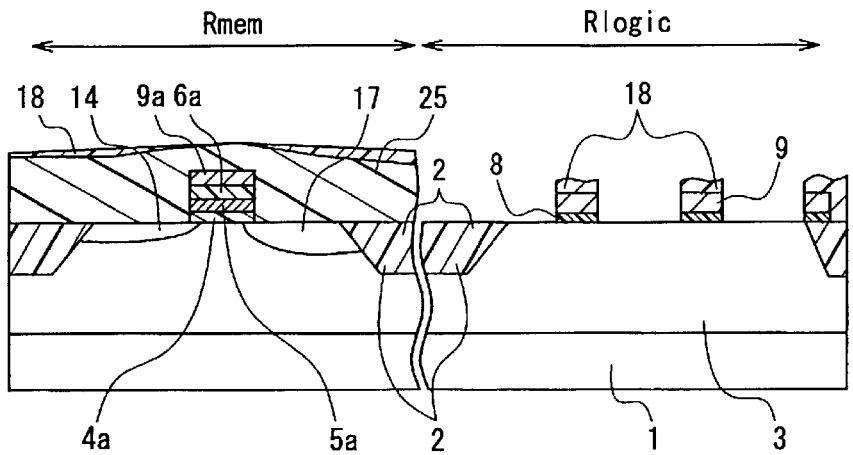
Figure 2C:
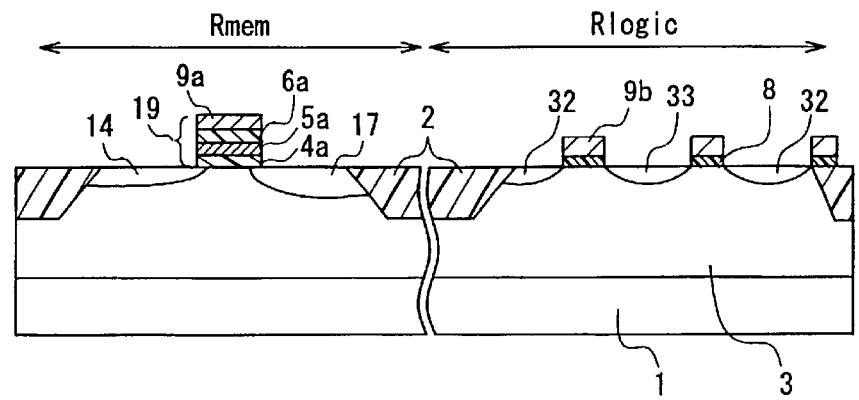

Then, as shown in FIG. 2B, the second polysilicon film 9 is etched by dry etching using the resist pattern 18 as a mask. During the dry etching, since the selective ratio of the polysilicon film to the resist pattern is generally low, the resist pattern 18 on the first gate 19 in the memory region $R_{mem}$ is worn away, and in some cases, the resist pattern 25 lying under the resist pattern 18 may be exposed. However, the dry etching resistance of the resist pattern 25 is higher than that of the resist pattern 18 because the resist pattern 25 is cured. Accordingly, during the etching of the second polysilicon film 9, the resist pattern 25 in the memory region $R_{mem}$ is worn away only slightly, which eliminates the possibility that an upper portion of the first gate 19 in the memory region $R_{mem}$ may be exposed. After the dry etching, the resist patters 18 and 25 are removed as shown in FIG. 2C.

Since the subsequent steps are the same as those in the conventional method, a description thereof has been omitted herein.

As described above, according to Embodiment 1, since the resist pattern 25 is not worn away considerably during the etching of the second polysilicon film 9, the possibility that the upper portion of the first gate 19 in the memory region $R_{mem}$ may be exposed is eliminated. Therefore, the gate electrode of the non-volatile semiconductor memory is prevented from being formed in an abnormal shape, thus allowing the semiconductor device with a normal shape to be obtained.

(Embodiment 2)

Figure 3A:
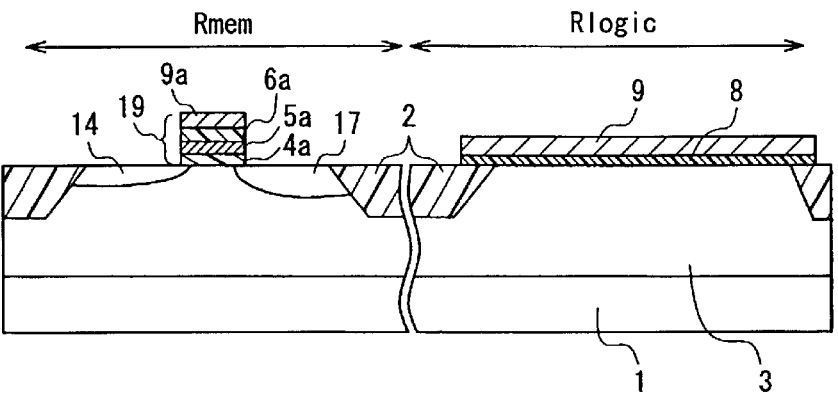
FIGS. 3A to 3C are cross-sectional views illustrating steps in a method for manufacturing a semiconductor device according to Embodiment 2 of the present invention.
Figure 3B:
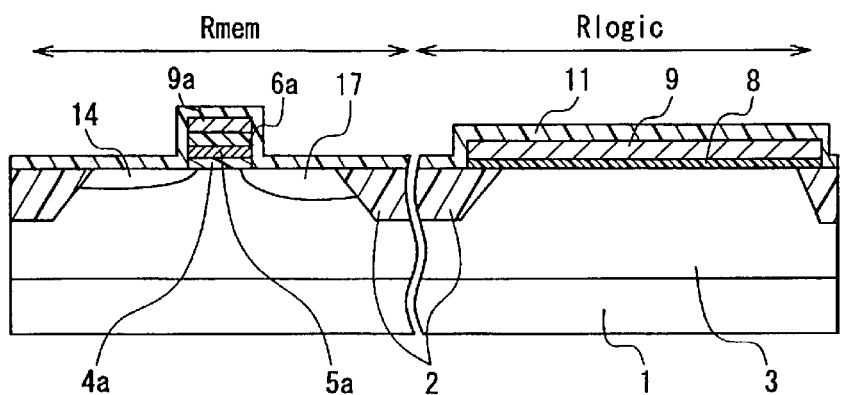
Figure 3C:
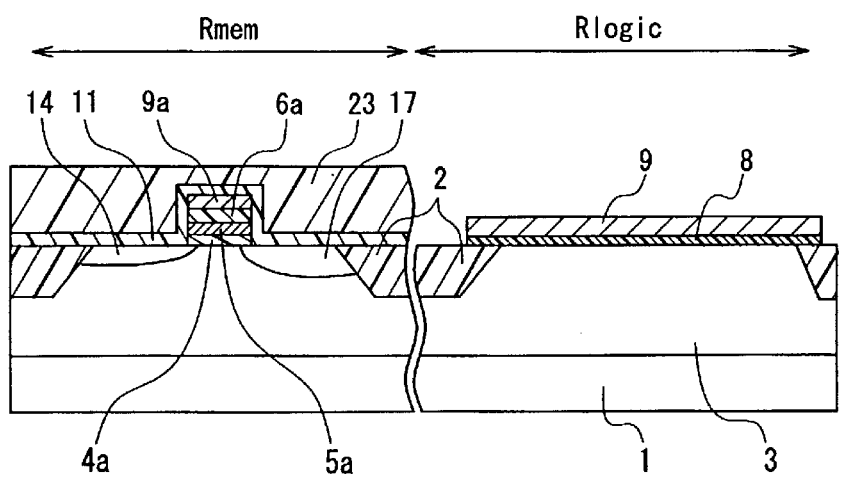

Hereinafter, a method for manufacturing a semiconductor device according to Embodiment 2 will be described with reference to the drawings. In Embodiment 2, since the steps performed prior to the step shown in FIG. 3A are the same as the conventional steps shown in FIGS. 8A to 10B, a description thereof has been omitted herein. FIGS. 3A to 3C are cross-sectional views illustrating steps in a method for manufacturing a semiconductor device according to Embodiment 2 of the present invention.

In FIGS. 3A to 3C, a first region where a non-volatile semiconductor memory such as an EEPROM or a flash memory is to be formed is indicated as a memory region $R_{mem}$. A second region where a standard semiconductor device such as a logic semiconductor device like an n-channel type MOS transistor or a p-channel type MOS transistor is to be formed is indicated as a logic region $R_{logic}$.

FIG. 3A is a cross-sectional view showing the state of the semiconductor device after a first gate 19 of the non-volatile semiconductor memory has been formed in the memory region $R_{mem}$. In the memory region $R_{mem}$, a tunnel insulating film 4a, a floating gate electrode 5a, a capacitor insulating film 6a, and a control gate electrode 9a are formed successively. On the other hand, in the logic region $R_{logic}$, a third insulating film 8 and a second polysilicon film 9 are formed on an insulating film 2 for separating the non-volatile semiconductor memory and the semiconductor device, a p-well 3, and a p-type silicon substrate 1.

Next, as shown in FIG. 3B, a silicon oxide film 11, for example, is formed as a protective film on the entire surface of the p-type silicon substrate 1. The thickness of the silicon oxide film 11 is about 20 nm, for example. Examples of a method for forming the silicon oxide film 11 include thermal oxidation, CVD, a SOG method, sputtering, etc. Other than the silicon oxide film, a silicon-based insulating film such as a silicon nitride film and a silicon oxynitride film may also be used as a protective film. Also, it is possible to use a multilayer film including two or more of these films as a protective layer.

Further, the silicon oxide film 11 as a protective film may also serve as a protective film for preventing the tunnel insulating film 4a and capacitor insulating film 6a from being damaged by ion implantations to be performed later.

Then, as shown in FIG. 3C, the silicon oxide film 11 on the second polysilicon film 9 in the logic region $R_{logic}$ is removed selectively. Examples of a method for selectively removing the silicon oxide film 11 include forming a resist pattern 23 that covers the memory region $R_{mem}$ and then removing the silicon oxide film 11 on the second polysilicon film 9 in the logic region $R_{logic}$ by dry etching or wet etching. The silicon oxide film 11 on the second polysilicon film 9 is removed because it is difficult to control the etching of a multilayer film including an oxide film and a polysilicon film.

Figure 4A:
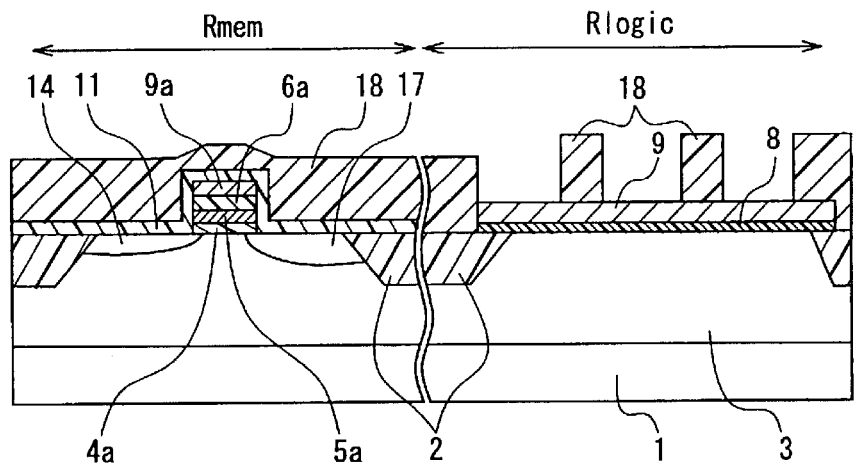
FIGS. 4A to 4C are cross-sectional views illustrating other steps in the method for manufacturing a semiconductor device according to Embodiment 2 of the present invention.

Subsequently, as shown in FIG. 4A, a resist pattern 18 is applied onto the p-type silicon substrate 1, and a gate electrode pattern 18 is formed on the second polysilicon film 9 in the logic region $R_{logic}$ by photolithography. The resist pattern 18 at this time is of a positive type and 0.7 µm in thickness and is formed by photolithography using a KrF excimer laser, for example. Further, the size of the gate electrode pattern is 0.25 µm, for example.

At this time, the first gate 19 already has been formed in the memory region $R_{mem}$. Since the first gate 19 has a laminated structure including two polysilicon films, the height thereof is greater than the total height of the third insulating film 8 and the second polysilicon film 9. In Embodiment 2, the height of the first gate 19 is greater than the total height of the third insulating film 8 and the second polysilicon film 9 by about 200 nm. Accordingly, above the first gate 19, the thickness of the resist pattern 18 is as small as 0.5 µm or less.

Figure 4B:
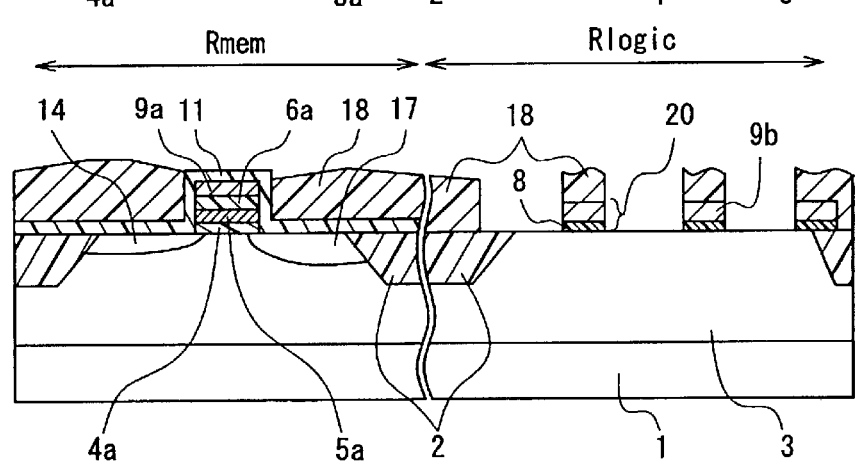

Next, as shown in FIG. 4B, the second polysilicon film 9 is etched by dry etching using the resist pattern 18 as a mask. During the dry etching, since the selective ratio of the polysilicon film to the resist pattern generally is low, the resist pattern 18 formed in the memory region $R_{mem}$ also is worn away by the etching. However, even if the resist is worn away to expose the first gate 19 during the etching, there is no fear that the exposed portion of the first gate 19 is removed since the surface of the first gate 19 is covered with the silicon oxide film 11 as a protective film. Therefore, a second gate 20 in the logic region $R_{logic}$ can be formed in the state where the first gate 19 of the non-volatile semiconductor memory is protected.

Then, using another resist pattern (not shown) that exposes the logic region $R_{logic}$, ion implantation for forming a low concentration drain region 32 and a low concentration source region 33 is performed in the logic region $R_{logic}$.

Figure 4C:
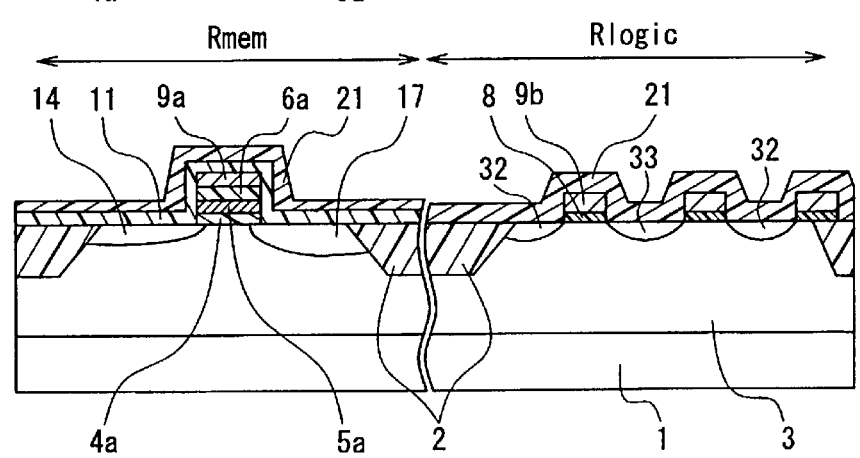

After that, the resist pattern 18 is removed as shown in FIG. 4C. Since the surface of the p-type silicon substrate 1 in the memory region $R_{mem}$ is covered with the silicon oxide film 11 at this time, the chances that the surfaces of high concentration source and drain regions of the non-volatile semiconductor memory may be corroded by the cleaning steps to be performed later can be reduced. Then, a silicon oxide film 21 as an insulating material is formed on the entire surface of the p-type silicon substrate 1 by CVD so that the semiconductor device in the logic region $R_{logic}$ will have an LDD structure.

Figure 5:
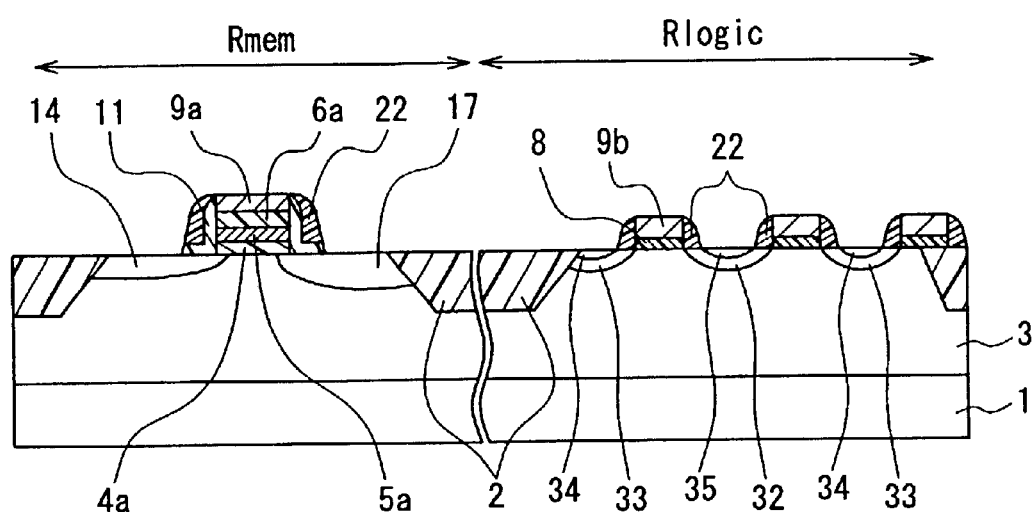
FIG. 5 is a cross-sectional view illustrating still another step in the method for manufacturing a semiconductor device according to Embodiment 2 of the present invention.

Next, as shown in FIG. 5, the silicon oxide film 21 is etched by anisotropic etching until the upper face of the first gate 19 in the memory region $R_{mem}$ and the upper face of the second gate 20 in the logic region $R_{logic}$ are exposed. As a result, a side-wall oxide film 22 is formed on the side walls of the first gate 19 and the second gate 20. Subsequently, using a resist pattern (not shown) that exposes the logic region $R_{logic}$, ion implantation is performed in the logic region $R_{logic}$, during which the second gate 20 and the side-wall oxide film 22 serve as a mask. As a result, a high concentration source region 35 and a high concentration drain region 34 are formed.

Thereafter, steps of wiring and forming a protective film for protecting the substrate surface further are performed to obtain a desired semiconductor device, although these steps are not illustrated in the drawings.

As can be seen from FIG. 5, while the side-wall oxide film of the second gate 20 in the logic region $R_{logic}$ is formed of the silicon oxide film 22 only, the side-wall oxide film of the first gate 19 in the memory region $R_{mem}$ has a laminated structure including the silicon oxide film 11 as a protective film and the silicon oxide film 22 for forming an LDD.

Embodiment 2 is directed to the case where the side-wall oxide film of the first gate 19 in the memory region $R_{mem}$ is formed of two films while the side-wall oxide film of the second gate 20 of the logic region $R_{logic}$ is formed of one film. However, the side-wall oxide film of the second gate 20 of the logic region $R_{logic}$ may be formed of a plurality of films. In this case, the number of the films forming the side-wall oxide film of the first gate 19 in the memory region $R_{mem}$ should be greater than the number of the films forming the side-wall oxide film of the second gate 20 of the logic region $R_{logic}$.

As described above, in Embodiment 2, the resist pattern 18 formed in the memory region $R_{mem}$ also is worn away during the dry etching of the second polysilicon film 9 in the logic region $R_{logic}$. However, even if the resist is worn away to expose the first gate 19 during the etching, there is no fear that the exposed portion of the first gate 19 is removed since the surface of the first gate 19 is covered with the silicon oxide film 11 as a protective film. Therefore, a second gate 20 in the logic region $R_{logic}$ can be formed in the state where the first gate 19 of the non-volatile semiconductor memory is protected. Accordingly, the gate electrode of the non-volatile semiconductor memory is prevented from being formed in an abnormal shape, thus allowing the semiconductor device having a normal shape to be obtained. In addition, it becomes possible to reduce the chances that the surfaces of high concentration source and drain regions of the non-volatile semiconductor memory may be worn away to cause reduction and fluctuation in a transistor current.

(Embodiment 3)

Figure 6A:
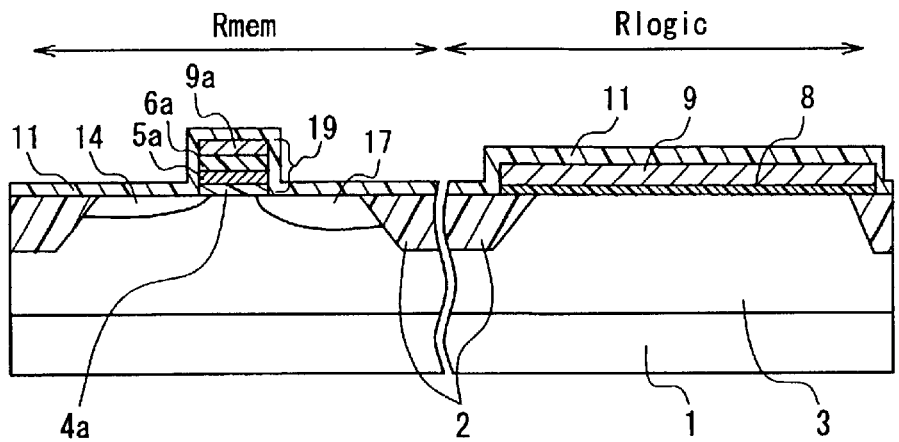
FIGS. 6A to 6C are cross-sectional views illustrating steps in a method for manufacturing a semiconductor device according to Embodiment 3 of the present invention.
Figure 6B:
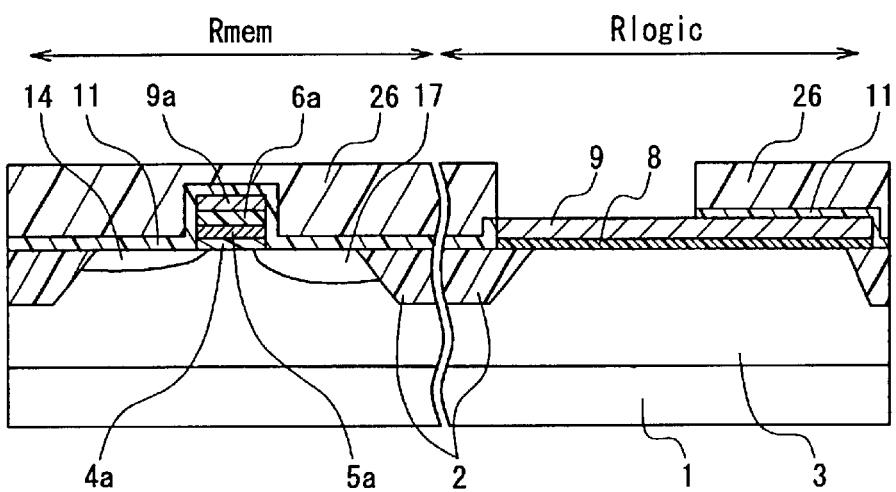
Figure 6C:
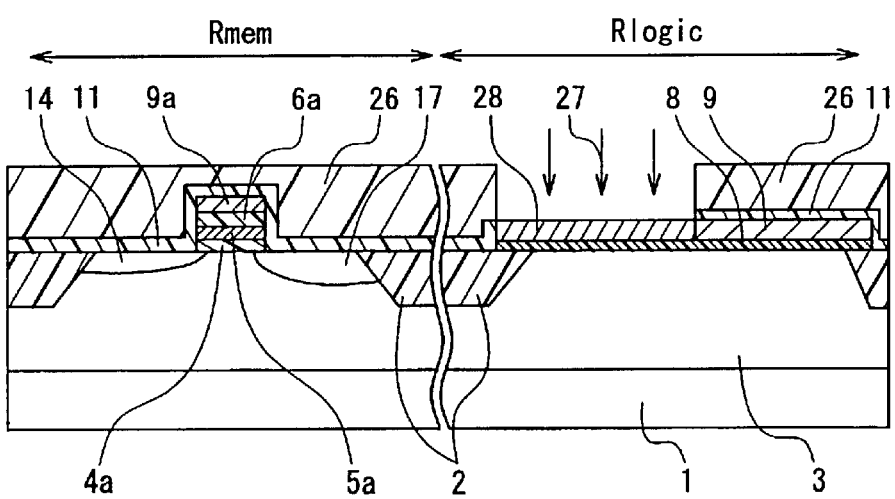
Figure 9A:
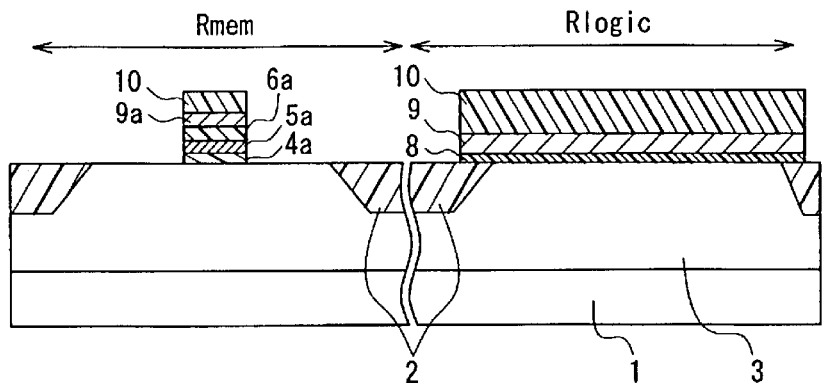
FIGS. 9A to 9C are cross-sectional views illustrating other steps in the conventional method for manufacturing a semiconductor device.
Figure 9B:
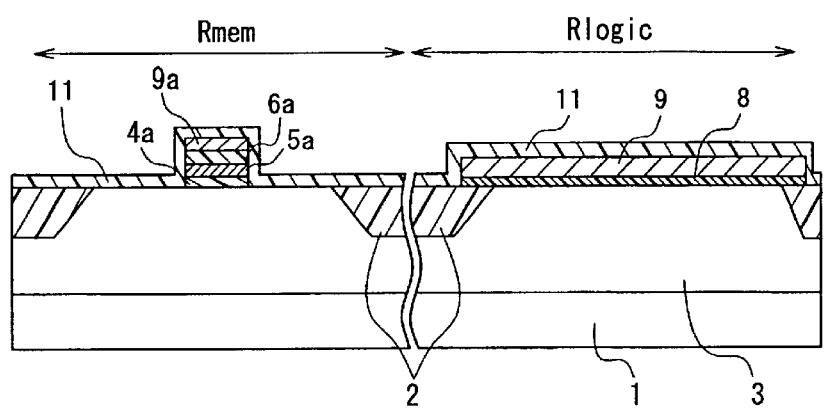
Figure 9C:
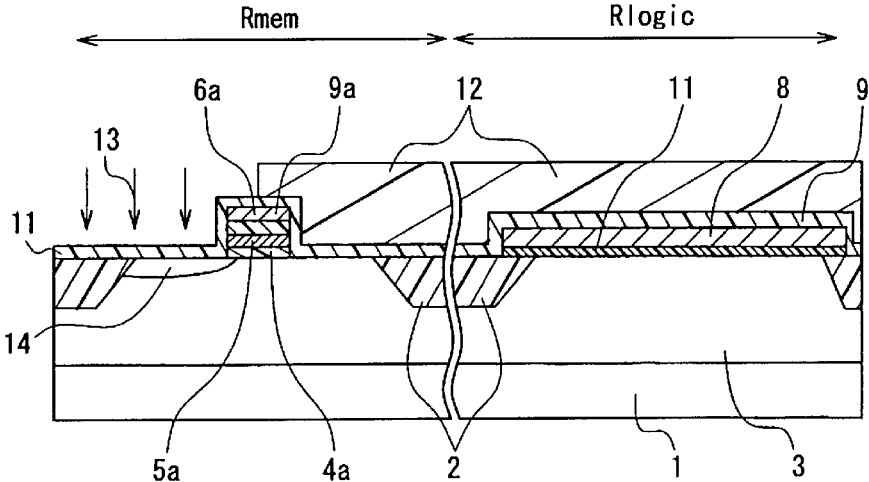
Figure 10A:
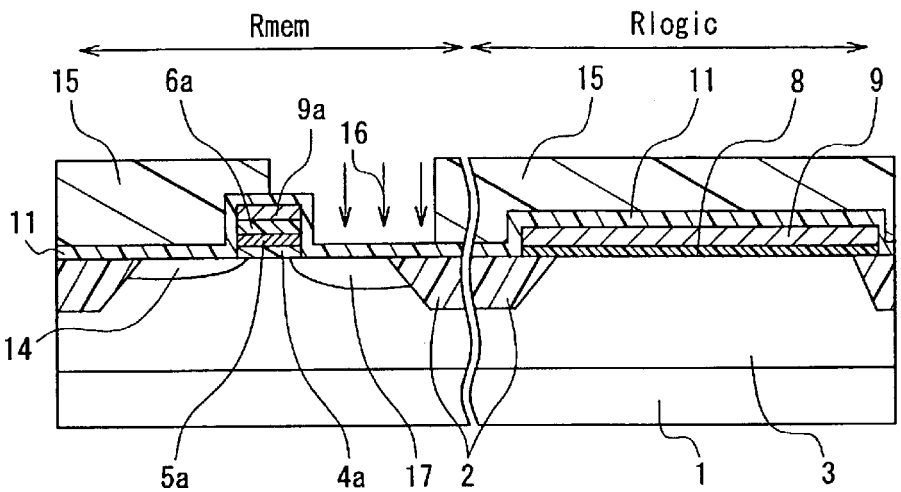
FIGS. 10A to 10C are cross-sectional views illustrating still other steps in the conventional method for manufacturing a semiconductor device.
Figure 10B:
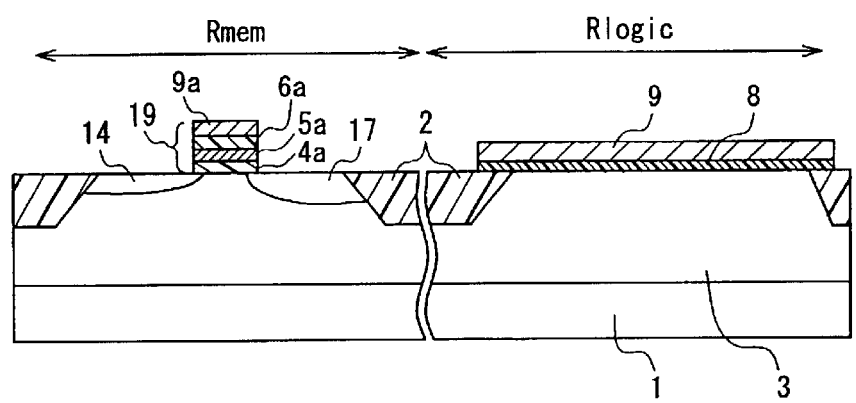
Figure 10C:
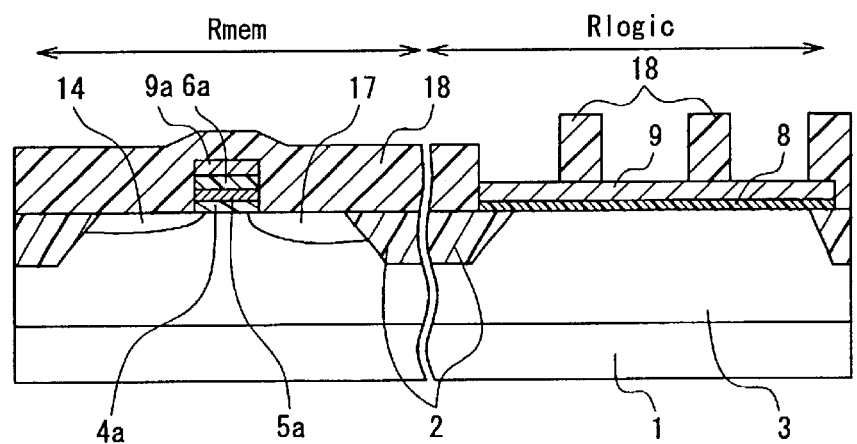
Figure 11A:
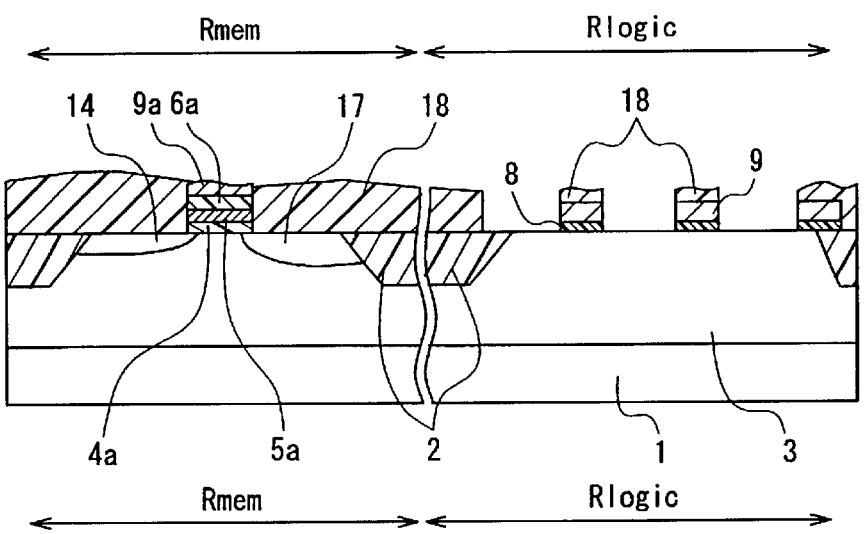
FIGS. 11A to 11B are cross-sectional views illustrating still other steps in the conventional method for manufacturing a semiconductor device.
Figure 11B:
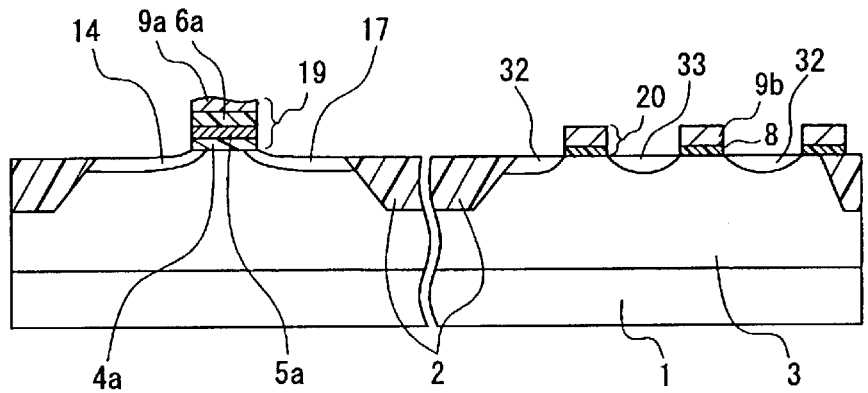
Figure 12A:
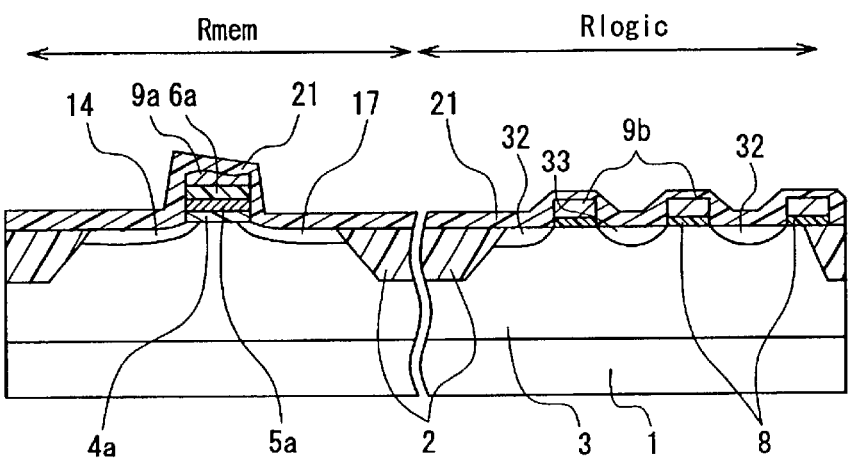
FIGS. 12A to 12B are cross-sectional views illustrating still other steps in the conventional method for manufacturing a semiconductor device.
Figure 12B:
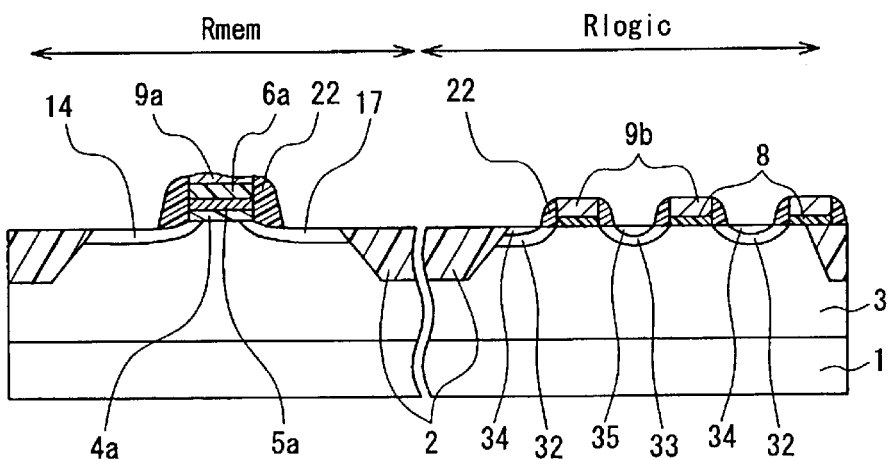

Hereinafter, a method for manufacturing a semiconductor device according to Embodiment 3 will be described with reference to the drawings. In Embodiment 3, since the steps performed prior to the step shown in FIG. 6A are the same as the steps performed prior to the step shown in FIG. 3B as described in Embodiment 2, a description thereof has been omitted herein. FIGS. 6A to 6C are cross-sectional views illustrating steps in a method for manufacturing a semiconductor device according to Embodiment 3 of the present invention.

In FIGS. 6A to 6C, a first region where a non-volatile semiconductor memory such as an EEPROM or a flash memory is to be formed is indicated as a memory region $R_{mem}$. A second region where a standard semiconductor device such as a logic semiconductor device like an n-channel type MOS transistor or a p-channel type MOS transistor is to be formed is indicated as a logic region $R_{logic}$.

FIG. 6A is a cross-sectional view showing the state of the semiconductor device after a first gate 19 of the non-volatile semiconductor memory has been formed in the memory region $R_{mem}$ and a silicon oxide film 11 as a protective film has been formed on a p-type silicon substrate 1. In the memory region $R_{mem}$, a tunnel insulating film 4a, a floating gate electrode 5a, a capacitor insulating film 6a, and a control gate electrode 9a are formed successively. On the other hand, in the logic region $R_{logic}$, a third insulating film 8 and a second polysilicon film 9 are formed on an insulating film 2 for separating the non-volatile semiconductor memory and the semiconductor device, a p-well 3, and the p-type silicon substrate 1.

In Embodiment 3, the second polysilicon film 9 is not doped with impurities at this time.

Next, as shown in FIG. 6B, a resist pattern 26 that exposes a region where an n-channel type semiconductor device is to be formed is formed in the logic region $R_{logic}$. Subsequently, the silicon oxide film 11 on the second polysilicon film 9 is removed selectively using this resist pattern 26 as a mask. The silicon oxide film 11 may be removed by dry etching or wet etching.

After that, as shown in FIG. 6C, the second polysilicon film 9 in the region where the n-channel type semiconductor device is to be formed is subjected to ion implantation 27. As a result, an n-type polysilicon 28 is formed. The ion implantation is performed using P ions, for example. It is to be noted here that either the removal of the silicon oxide film 11 or the ion implantation may be performed first.

Subsequently, as shown in FIG. 7A, after the resist pattern 26 has been removed, a resist pattern 29 that exposes a region where a p-channel type semiconductor device is to be formed is formed in the logic region $R_{logic}$. Thereafter, a silicon oxide film 11 on the second polysilicon film 9 is selectively removed using this resist pattern 29 as a mask. The silicon oxide film 11 may be removed by dry etching or wet etching.

Next, as shown in FIG. 7B, the second polysilicon film 9 in the region where the p-channel type semiconductor device is to be formed is subjected to ion implantation 30. As a result, a p-type polysilicon 31 is formed. The ion implantation is performed using B ions, for example. It is to be noted that either the step of removing the silicon oxide film 11 or the ion implantation may be performed first. After that, the resist pattern 29 is removed as shown in FIG. 7C.

It is to be noted that either the n-type polysilicon 28 or the p-type polysilicon 31 may be formed first.

Since the subsequent steps are the same as the steps performed subsequent to the step shown in FIG. 3C as described in Embodiment 1, a description thereof has been omitted herein.

As described above, according to Embodiment 3, since the silicon oxide film 11 on the second polysilicon film 9 in the logic region $R_{logic}$ is removed using the mask for use in ion implantation for forming a dual gate, the necessity of an additional photolithography step is eliminated, which allows a preferable semiconductor device to be obtained at low cost.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for forming a semiconductor device comprising:
    a first step of forming a non-volatile semiconductor memory in a first region of a substrate of the semiconductor device, the non-volatile semiconductor memory comprising a first gate that comprises a tunnel insulating film, a floating gate electrode, a capacitor insulating film, and a control gate electrode; and
    a second step of forming a semiconductor device in a second region of the substrate, the semiconductor device comprising a second gate that comprises a gate insulating film and a gate electrode,
    wherein, during patterning of the second gate, a surface of the first gate is covered with a protective film that is hardly etched by an etchant used for the patterning of the second gate, and an etching resistance of the protective film is higher than that of a resist pattern used as a mask for patterning of the second gate.

2. The method for forming a semiconductor device according to claim 1,
    wherein a height of the first gate is at least 200 nm greater than that of the second gate.

3. The method for forming a semiconductor device according to claim 1,
    wherein the protective film is a photosensitive resin film that has been cured.

4. The method for forming a semiconductor device according to claim 2,
    wherein the protective film is a photosensitive resin film that has been cured.

5. The method for forming a semiconductor device according to claim 1,
    wherein, when a mask material that has been used for patterning the second gate is removed, a source region and a drain region of the non-volatile semiconductor memory are covered with the protective film.

6. The method for forming a semiconductor device according to claim 2,
    wherein, when a mask material that has been used for patterning the second gate is removed, a source region and a drain region of the non-volatile semiconductor memory are covered with the protective film.

7. The method for forming a semiconductor device according to claim 1,
    wherein the protective film is one film selected from a silicon oxide film, a silicon nitride film, and a silicon oxynitride film, or a multilayer film including two or more of these films.

8. The method for forming a semiconductor device according to claim 2,
    wherein the protective film is one film selected from a silicon oxide film, a silicon nitride film, and a silicon oxynitride film, or a multilayer film including two or more of these films.

9. The method for forming a semiconductor device according to claim 5,
    wherein the protective film is one film selected from a silicon oxide film, a silicon nitride film, and a silicon oxynitride film, or a multilayer film including two or more of these films.

10. The method for forming a semiconductor device according to claim 6,
    wherein the protective film is one film selected from a silicon oxide film, a silicon nitride film, and a silicon oxynitride film, or a multilayer film including two or more of these films.

11. The method for forming a semiconductor device according to claim 7,
    wherein the protective film is formed by chemical vapor deposition.

12. The method for forming a semiconductor device according to claim 8,
    wherein the protective film is formed by chemical vapor deposition.

13. The method for forming a semiconductor device according to claim 9,
    wherein the protective film is formed by chemical vapor deposition.

14. The method for forming a semiconductor device according to claim 10, wherein the protective film is formed by chemical vapor deposition.

15. The method for forming a semiconductor device according to claim 7,
   wherein the protective film is a silicon oxide film formed by thermal oxidation.

16. The method for forming a semiconductor device according to claim 8,
   wherein the protective film is a silicon oxide film formed by thermal oxidation.

17. The method for forming a semiconductor device according to claim 9,
   wherein the protective film is a silicon oxide film formed by thermal oxidation.

18. The method for forming a semiconductor device according to claim 10, wherein the protective film is a silicon oxide film formed by thermal oxidation.

19. A method for forming a semiconductor device comprising: a first step of forming a first gate in a first region of a substrate of the semiconductor device; and
   a second step of forming a semiconductor device in a second region of the substrate, the semiconductor device comprising a second gate that comprises a gate insulating film and a gate electrode,
   wherein during patterning of the second gate, a surface of the first gate is covered with a protective film that is hardly etched by an etchant used for the patterning of the second gate, and an etching resistance of the protective film is higher than that of a resist pattern used as a mask for patterning of the second gate.

* * * * *